(12) United States Patent
Darmawan

(10) Patent No.: US 6,740,548 B2
(45) Date of Patent: May 25, 2004

(54) METHOD OF MANUFACTURE OF SILICON ON INSULATOR DEVICE WITH IMPROVED HEAT REMOVAL

(75) Inventor: Johan Agus Darmawan, Santa Clara, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 10/327,479

(22) Filed: Dec. 20, 2002

(65) Prior Publication Data

US 2003/0107084 A1 Jun. 12, 2003

Related U.S. Application Data

(62) Division of application No. 10/053,424, filed on Nov. 2, 2001.

(51) Int. Cl.[7] .............................................. H01L 21/84
(52) U.S. Cl. .................. 438/149; 438/479; 438/517
(58) Field of Search .............................. 438/149, 479, 438/517; 257/347

(56) References Cited

U.S. PATENT DOCUMENTS

| | | | |
|---|---|---|---|
| 4,091,408 A | * 5/1978 | Lee et al. | .................... 257/523 |
| 5,475,254 A | * 12/1995 | Takahashi | .................... 257/536 |
| 5,949,104 A | 9/1999 | D'Anna et al. | |
| 6,034,415 A | 3/2000 | Johnson et al. | |
| 6,048,772 A | 4/2000 | D'Anna | |
| 6,063,678 A | 5/2000 | D'Anna | |
| 6,064,088 A | 5/2000 | D'Anna | |
| 6,190,978 B1 | 2/2001 | D'Anna | |
| 6,222,233 B1 | 4/2001 | D'Anna | |
| 6,236,103 B1 | * 5/2001 | Bernstein et al. | ............ 257/532 |
| 6,259,099 B1 | 7/2001 | Foulon et al. | |
| 6,483,147 B1 | * 11/2002 | Lin | ............................. 257/347 |
| 6,512,292 B1 | * 1/2003 | Armbrust et al. | ............ 257/712 |
| 2002/0041003 A1 | 4/2002 | Udrea et al. | |
| 2002/0117681 A1 | * 8/2002 | Weeks et al. | ................. 257/106 |

* cited by examiner

Primary Examiner—Wael Fahmy
Assistant Examiner—Nathan W. Ha
(74) Attorney, Agent, or Firm—Beyer Weaver & Thomas, LLP

(57) ABSTRACT

A semiconductor device is fabricated in a silicon on insulator (SOI) substrate including a supporting silicon substrate, a silicon oxide layer supported by the substrate, and a silicon layer overlying the silicon oxide layer. An electrical component is fabricated in the silicon layer over a portion of the silicon oxide layer, and then the substrate opposite from the component is masked and etched. A metal layer is then formed in the portion of the substrate which has been removed by etching with the metal layer providing heat removal from the component. In an alternative embodiment, the silicon oxide layer overlying the portion of the substrate is removed with the metal layer abutting the silicon layer. In fabricating the device, preferential etching is employed to remove the silicon in the substrate with the silicon oxide functioning as an etchant stop. A two step process can be employed including a first oxide etch to etch the bulk of the silicon and then a more selective but slower etch. Then, the exposed silicon oxide can then be removed, as in the alternative embodiment, by a preferential etchant of silicon oxide.

9 Claims, 3 Drawing Sheets

METHOD OF MANUFACTURE OF SILICON ON INSULATOR DEVICE WITH IMPROVED HEAT REMOVAL

CROSS-REFERENCES TO RELATED APPLICATIONS

This application claims priority to U.S. application Ser. No. 10/053,424, filed Nov. 2, 2001, which is incorporated herein for all purposes.

BACKGROUND OF THE INVENTION

This invention relates generally to semiconductor devices and manufacturing processes, and more particularly, the invention relates to such devices fabricated in silicon on insulator (SOI) structures.

Reduced parasitic components can be achieved in semiconductor devices by fabrication of the devices in a silicon on insulator structure, such as silicon on sapphire and silicon on oxide insulator, including commercially available bonded silicon on insulator and implanted oxide (SIMOX). In such structures the supporting substrate is typically bonded to a heat sink for heat removal, which is particularly important for power transistor structures. Additionally, a ground plane can be provided by metallization on the substrate surface.

The present invention is directed to an improved method of fabricating silicon on insulator structures with improved heat removal and circuit ground configurations including low resistance ground paths.

BRIEF SUMMARY OF THE INVENTION

In accordance with the invention a semiconductor device is fabricated in a silicon on insulator (SOI) substrate including a supporting silicon substrate, a silicon oxide layer supported by the substrate, and a silicon layer over the silicon oxide layer. More particularly, an electrical component such as a transistor or capacitor, for example, is fabricated in the silicon layer over a portion of the silicon oxide layer, and then the portion of the substrate opposite from the component is masked and etched. A metal layer is then formed in the portion of the substrate which has been removed by etching with the metal layer providing heat removal from the component. In an alternative embodiment, the silicon oxide layer overlying the portion of the substrate is removed with the metal layer abutting the silicon layer.

In fabricating the device, preferential etching can be employed to remove the silicon in the substrate with the silicon oxide functioning as an etchant stop. A two step etch can be applied, also, with the last etch being preferential. The exposed silicon oxide can then be removed, as in the alternative embodiment, by preferential etchant of silicon oxide.

A hard mask of silicon nitride, for example, can be formed on a surface of the substrate for the silicon etching. Infra red mask alignment or mirror alignment can be employed in masking and etching the silicon nitride in forming the hard mask. The metal layer preferably comprises a refractory metal covered by gold. Wafer abrasion can be employed to thin the substrate prior to masking and etching.

The invention and objects and features thereof will be more readily apparent when the following detailed description and appended claims when taken with drawings.

DETAILED DESCRIPTION OF THE INVENTION

Figure 1A:
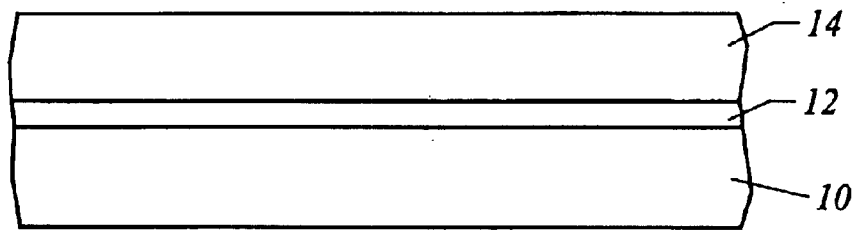
FIGS. 1A–1D are section views illustrating steps in fabricating a semiconductor device in accordance with an embodiment of the invention.

FIGS. 1A–1D are section views illustrating steps in fabricating a silicon on insulator device in accordance with one embodiment of the invention. In FIG. 1A a SOI structure is provided which can be bonded silicon or oxide implanted silicon in which a silicon substrate 10 supports a silicon oxide layer 12 with a layer of silicon 14 provided over silicon oxide layer 12. Such SOI structures are well known and commercially available for use in semiconductor device fabrication.

Figure 1B:
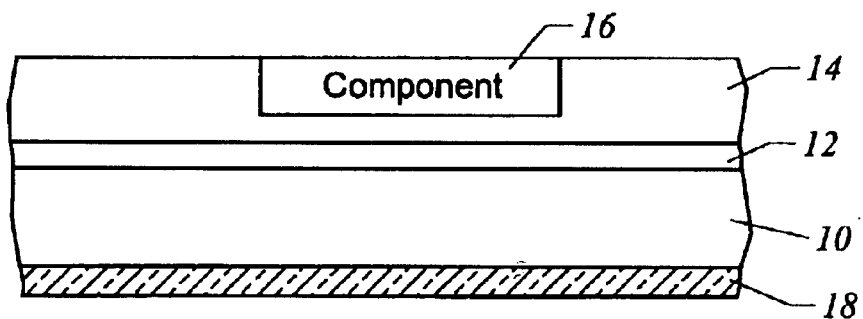
Figure 3A:
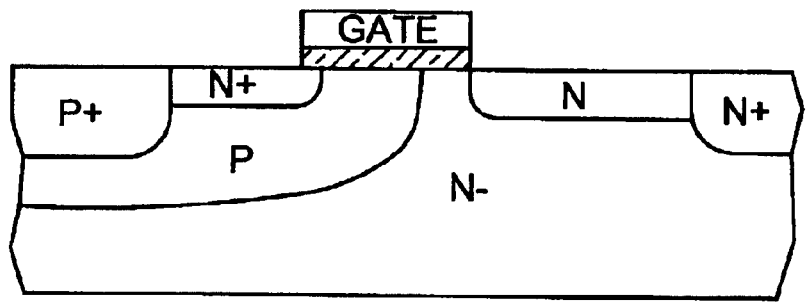
FIGS. 3A–3C are section views illustrating known electrical components which can be fabricated in a semiconductor device in accordance with the invention.
Figure 3B:
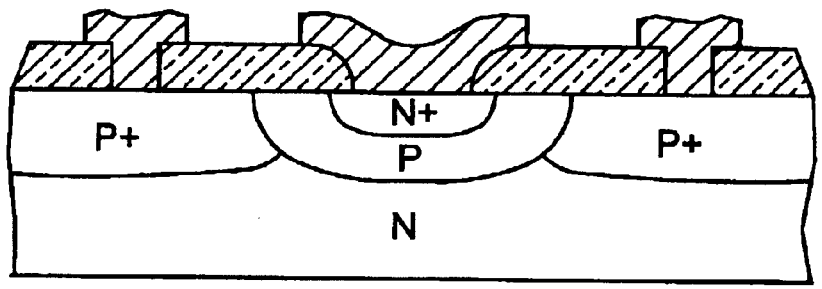
Figure 3C:
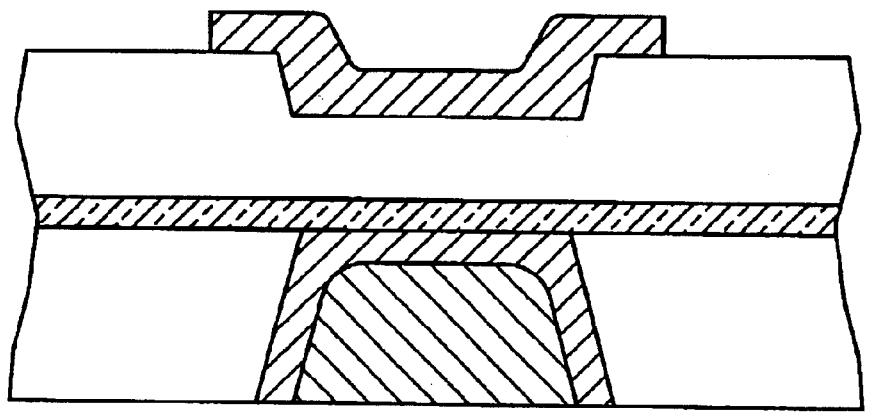

As shown in FIG. 1B an electrical component 16 is fabricated in silicon layer 14 using conventional photoresist masking, etching, and doping techniques. Component 16 can be any semiconductor device such as: a lateral DMOS transistor as illustrated in section view in FIG. 3A, a bipolar transistor as illustrated in FIG. 3B or a capacitor or varactor as illustrated in FIG. 3C. These and other semiconductor devices are well known and the manufacturing of such devices employs conventional semiconductor processing techniques.

Figure 1C:
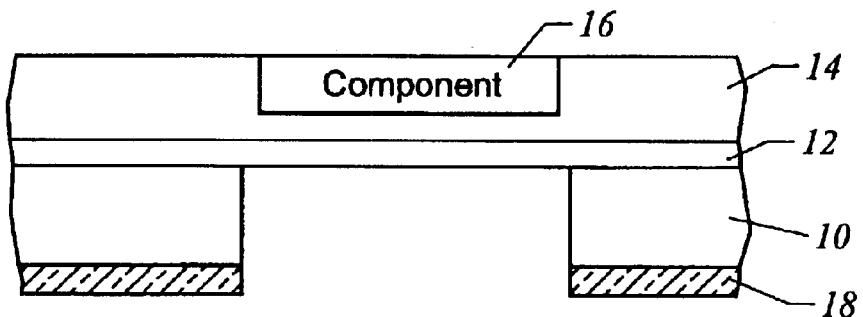

As further shown in FIG. 1B, a silicon nitride or an oxide/nitride sandwich layer 18 is formed on a surface of substrate 10 opposite from component 16 which is selectively masked and etched to function as a hard mask in the etching of substrate 10, as shown in FIG. 1C. Advantageously, a preferential etchant such as potassium hydroxide or a dry plasma etch such as $CF_4+O_2$ can be employed to etch the silicon in substrate 10 with silicon oxide layer 12 functioning as an etchant stop, thereby preventing overetching into silicon layer 14.

Figure 1D:
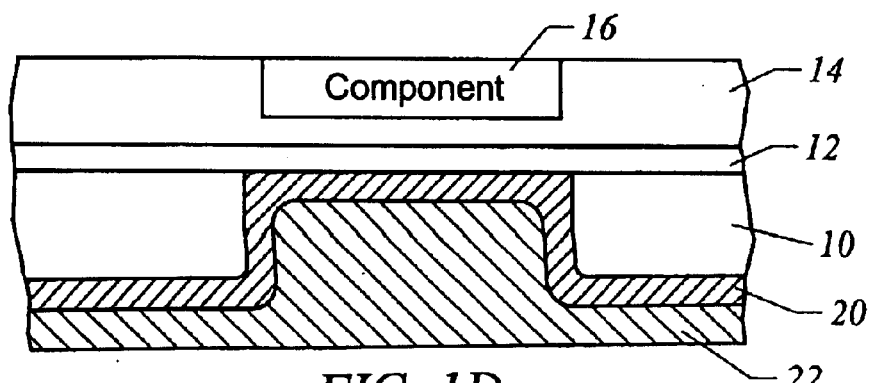

Thereafter, as illustrated in FIG. 1D, a refractory metal layer 20 is deposited over the surface of substrate 10 and in the etched portion in abutment with silicon oxide layer 12. Any of the known refractory metals can be employed, such as, for example, titanium tungsten and titanium nitride. Refractory metal layer 20 is then covered by a metal layer 22 such as gold, copper or aluminum, which can be subsequently lapped to form a planar metal surface on substrate 10. Advantageously, by removing the substrate material underlying component 16, the metal heat sink of layers 20, 22 is closer to component 16 and facilitates the removal of heat therefrom. The metal layer can also function as a ground for the component. Substrate resistance is also reduced.

Figure 2A:
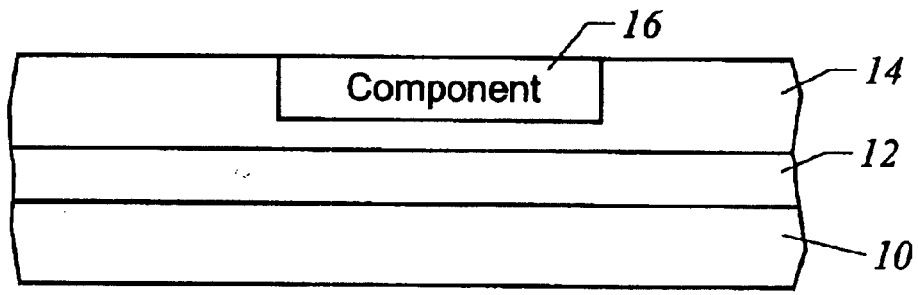
FIGS. 2A–2C are section views illustrating steps in fabricating a semiconductor device in accordance with another embodiment of the invention.
Figure 2B:
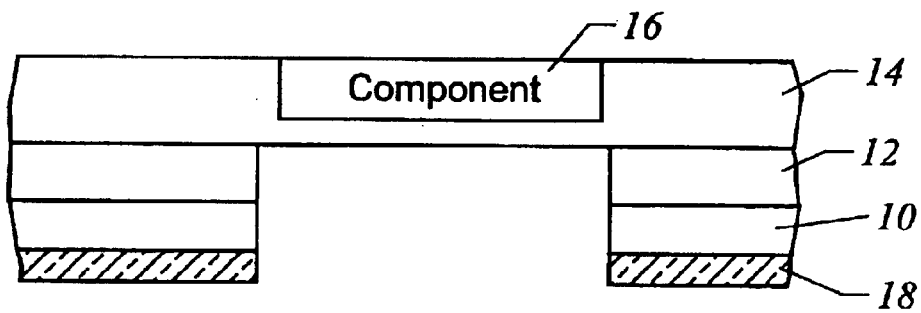
Figure 2C:
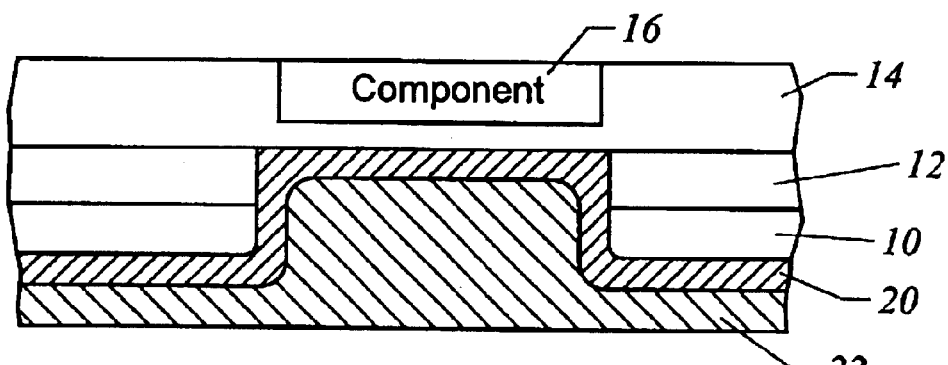

FIGS. 2A–2C are section views illustrating an alternative embodiment of the invention. Following fabrication of the component 16 as shown in FIG. 1B but before the formation of silicon nitride layer 18, substrate 10 is abraded to thin the substrate and reduce the amount of subsequent etching required to expose the silicon oxide layer 12, as shown in FIG. 2A.

The structure of FIG. 2A can be further etched as shown in FIG. 2B to remove not only a portion of substrate 10 but also the exposed silicon oxide layer 12 underlying component 16 by the use of a preferential etchant of silicon oxide such as wet buffered HF acid or a dry plasma etch. In this embodiment the metal layers 20, 22 abut silicon layer 14 immediately below component 16 and thereby further facilitates heat removal and can be readily employed as a ground for the component, while also reducing substrate resistance.

The device in accordance with the invention has reduced thermal resistance by putting the metal in close proximity to the component heat source and also reduces substrate resistance due to the close proximity of the metal to the active transistor. Advantageously, the method utilizes the silicon oxide layer between the two silicon layers as an etch stop which enables the etching of a thick substrate with good consistency without overetching into the active silicon. The thickness of the refractory barrier metal and gold can be adjusted to provide adequate heat sink capability. If the silicon oxide layer is left in place, the barrier metal is optional. Thus the metal heat sink can be within a few microns of the actual heat generation source without having to thin down the entire wafer.

While the invention has been described with reference to specific embodiments, the description is illustrative the invention and is not to be construed as limiting the invention. Various modifications and applications may occur to those skilled in the art without departing from the true spirit and scope of the invention as defined by the appended claims.

What is claimed is:

1. A method of fabricating a semiconductor device in a silicon on insulator (SOI) substrate comprising the steps of:
   a) providing a semiconductor body including a silicon supporting substrate, a silicon oxide layer supported by the substrate, and a silicon layer overlying the silicon oxide layer;
   b) forming a semiconductor component in the silicon layer over a portion of the silicon oxide layer;
   c) forming an etch mask on a surface of the substrate opposite from the component including forming a silicon nitride layer on the surface of the substrate and then preferentially masking and etching the silicon nitride layer to expose the silicon in the substrate underlying the portion of the silicon oxide layer;
   d) applying a preferential etchant through the etch mask to selectively etch the silicon in the substrate underlying the portion of the silicon oxide layer; and
   e) providing a metal layer in the etched portion of the substrate to provide heat removal from the component during operation of the component.

2. The method as defined by claim 1 wherein the metal layer comprises a refractory metal.

3. The method as defined by claim 2 wherein the metal layer further comprises gold, copper or aluminum over the refractory metal.

4. The method as defined by claim 3 wherein the refractory metal comprises titanium tungsten or titanium nitride.

5. The method as defined by claim 1 wherein the silicon nitride layer is preferentially etched with a dry plasma, and the silicon is preferentially etched with potassium hydroxide.

6. The method as defined by claim 5, wherein the silicon nitride is preferentially etched with a plasma and the silicon is preferentially etched with a plasma.

7. The method as defined by claim 1 and further including a step before step c) of abrading the substrate surface opposite from the component to reduce the thickness of the supporting substrate.

8. The method as defined by claim 1 wherein step a) includes providing a bonded silicon on insulator wafer.

9. The method as defined by claim 1 wherein step a) comprises providing a silicon wafer with implanted silicon oxide layer therein.

* * * * *